(12) United States Patent
Peng et al.

(10) Patent No.: US 7,180,013 B2
(45) Date of Patent: Feb. 20, 2007

(54) ELECTRONIC DEVICE INCORPORATING HOOD FASTENER

(75) Inventors: Wen-Tang Peng, Tu-cheng (TW); Mo-Ming Yu, Shenzhen (CH); Zhe Zhang, Shenzhen (CH); Shao-Kun Chen, Shenzhen (CH)

(73) Assignees: Hon Fu Jin Precision Industry (Shenzhen) Co., Ltd. (CN); Hon Hai Precision Industry Co., Ltd. (TW)

( * ) Notice: Subject to any disclaimer, the term of this patent is extended or adjusted under 35 U.S.C. 154(b) by 0 days.

(21) Appl. No.: 11/377,821

(22) Filed: Mar. 16, 2006

(65) Prior Publication Data

US 2006/0267463 A1    Nov. 30, 2006

(30) Foreign Application Priority Data

Apr. 29, 2005   (CH) .................. 2005 1 0034508

(51) Int. Cl.
*H05K 7/14* (2006.01)
(52) U.S. Cl. .................. 174/542; 361/756; 361/759; 174/541
(58) Field of Classification Search ............. 174/541, 174/542; 361/683, 756, 759, 752
See application file for complete search history.

(56) References Cited

U.S. PATENT DOCUMENTS

| 5,045,638 | A  | * | 9/1991  | Wada et al. ............... 174/377 |
| 5,661,640 | A  | * | 8/1997  | Mills et al. ................ 361/801 |
| 5,774,337 | A  | * | 6/1998  | Lee et al. .................. 361/725 |
| 6,288,329 | B1 | * | 9/2001  | Kopp et al. ................ 174/378 |
| 6,339,536 | B1 | * | 1/2002  | Buican et al. ............. 361/818 |
| 6,382,744 | B1 |   | 5/2002  | Xiao |
| 6,469,904 | B1 | * | 10/2002 | Vigeant et al. ............ 361/752 |

FOREIGN PATENT DOCUMENTS

| TW | 386613 | 4/2000 |
| TW | 438213 | 5/2001 |

* cited by examiner

*Primary Examiner*—Hung V. Ngo
(74) *Attorney, Agent, or Firm*—Morris Manning & Martin LLP; Tim Tingkang Xia, Esq.

(57) ABSTRACT

An electronic device includes a cage, a hood, a fastener, and a resilient member. The hood is detachably secured to the cage. The hood includes a first post and a second post extending downwardly from a side thereof respectively. The fastener is movably mounted to the cage. The fastener includes a first guiding surface for the first post sliding thereon during assembling the hood to the cage, and a second guiding surface for the second post sliding thereon during removing the hood from the cage. The resilient member is connected between the fastener and the cage.

20 Claims, 8 Drawing Sheets

ELECTRONIC DEVICE INCORPORATING HOOD FASTENER

BACKGROUND

1. Field of the Invention

The present invention relates to electronic devices, and particularly to an electronic device having a hood readily attached thereto and detached therefrom by means of a fastener.

2. General Background

A conventional electronic device generally includes a cage, a hood and a bezel. The cage is used to hold components such as a motherboard, interface cards, a power supply and disk drives. The cage is generally U-shaped, and comprises a base, a front panel and a rear panel. The hood is also U-shaped, and has a top panel and two opposite side panels depending from the top panel. The hood is slidably attached to the cage along rails formed on opposite sides of the cage, and then secured to the rear panel with screws.

However, securing the hood to the rear panel with screws is unduly cumbersome and time-consuming. Furthermore, it is difficult to simultaneously align both side edges of the hood with the respective rails of the cage.

Another kind of conventional hood is secured to a cage by means of engagement of locking catches of the hood with slots of the cage. However, disengaging this kind of hood from the cage is often laborious.

What is needed is to provide an electronic device which overcomes the above-mentioned problems.

SUMMARY

An exemplary electronic device includes a cage, a hood, a fastener, and a resilient member. The hood is detachably secured to the cage. The hood includes a first post and a second post extending downwardly from a side thereof respectively. The fastener is movably mounted to the cage. The fastener includes a first guiding surface for the first post of the hood sliding thereon during assembling the hood to the cage, and a second guiding surface for the second post of the hood sliding thereon during removing the hood from the cage. The resilient member is connected between the fastener and the cage.

Other advantages and novel features of the invention will become more apparent from the following detailed description when taken in conjunction with the accompanying drawings, in which:

DETAILED DESCRIPTION OF THE EMBODIMENT

Figure 1:
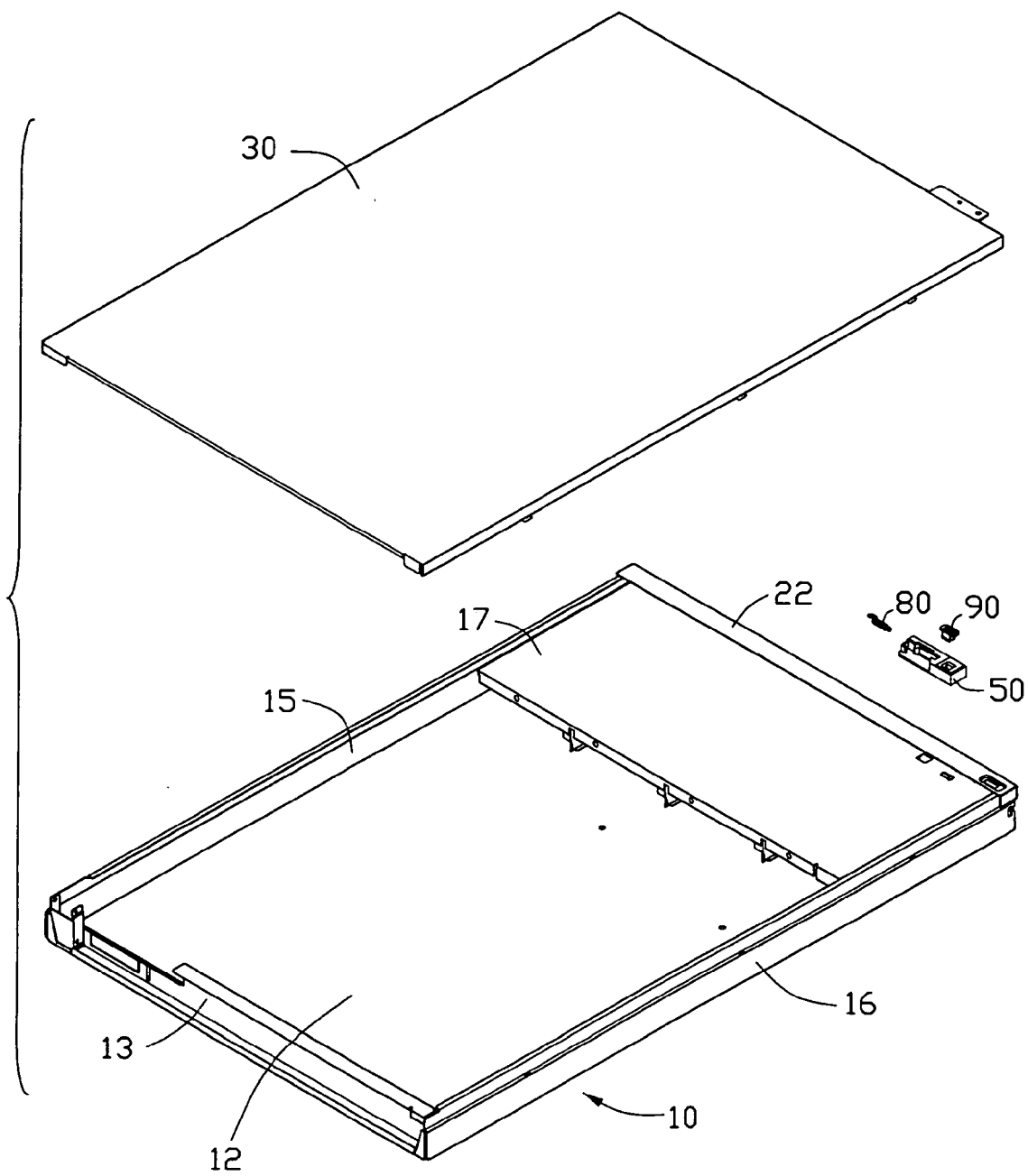
FIG. 1 is an exploded, isometric view of an electronic device in accordance with a preferred embodiment of the present invention; the electronic device includes a cage, a hood and a fastener.
Figure 2:
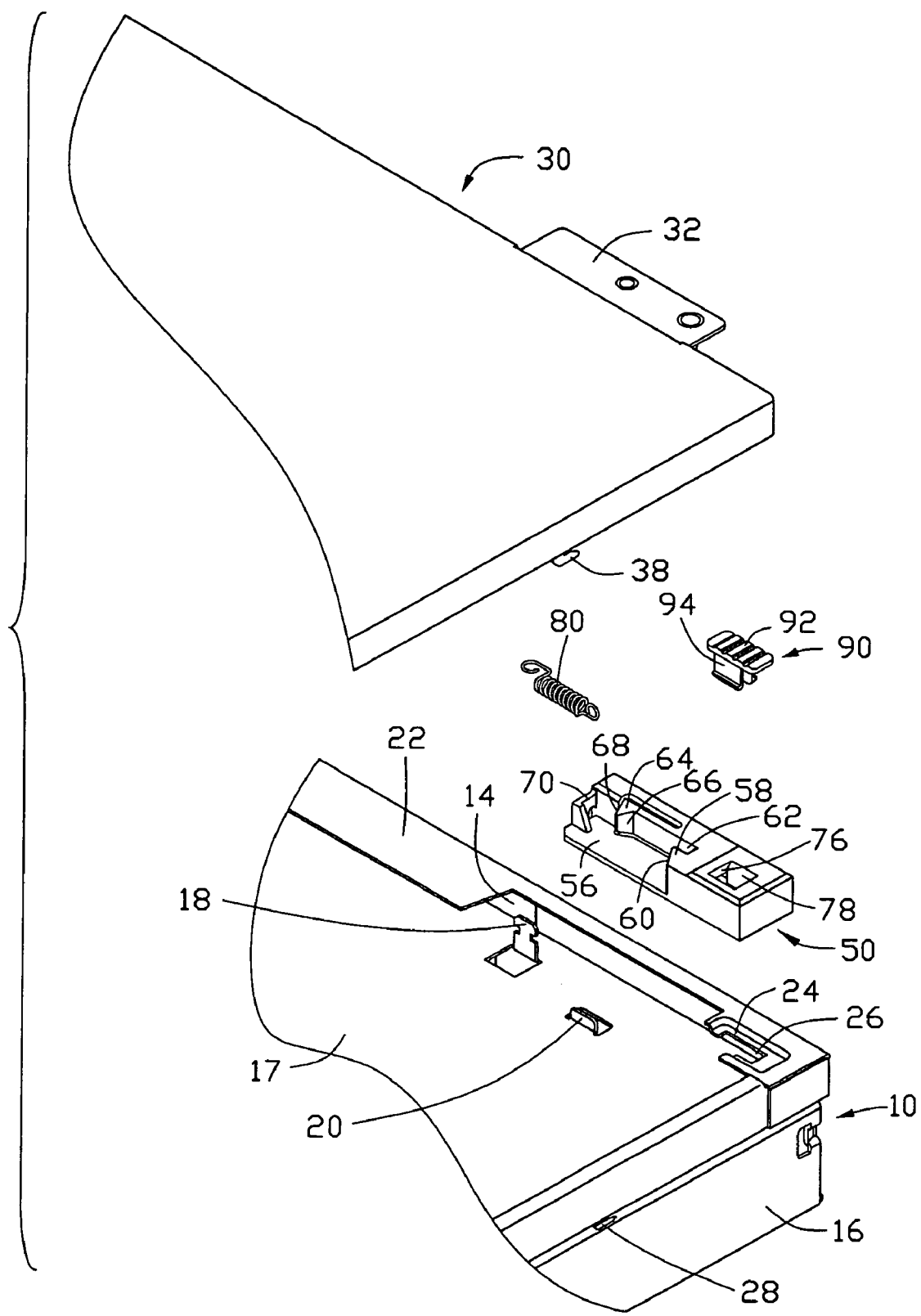
FIG. 2 is an enlarged view of parts of FIG. 1.
Figure 3:
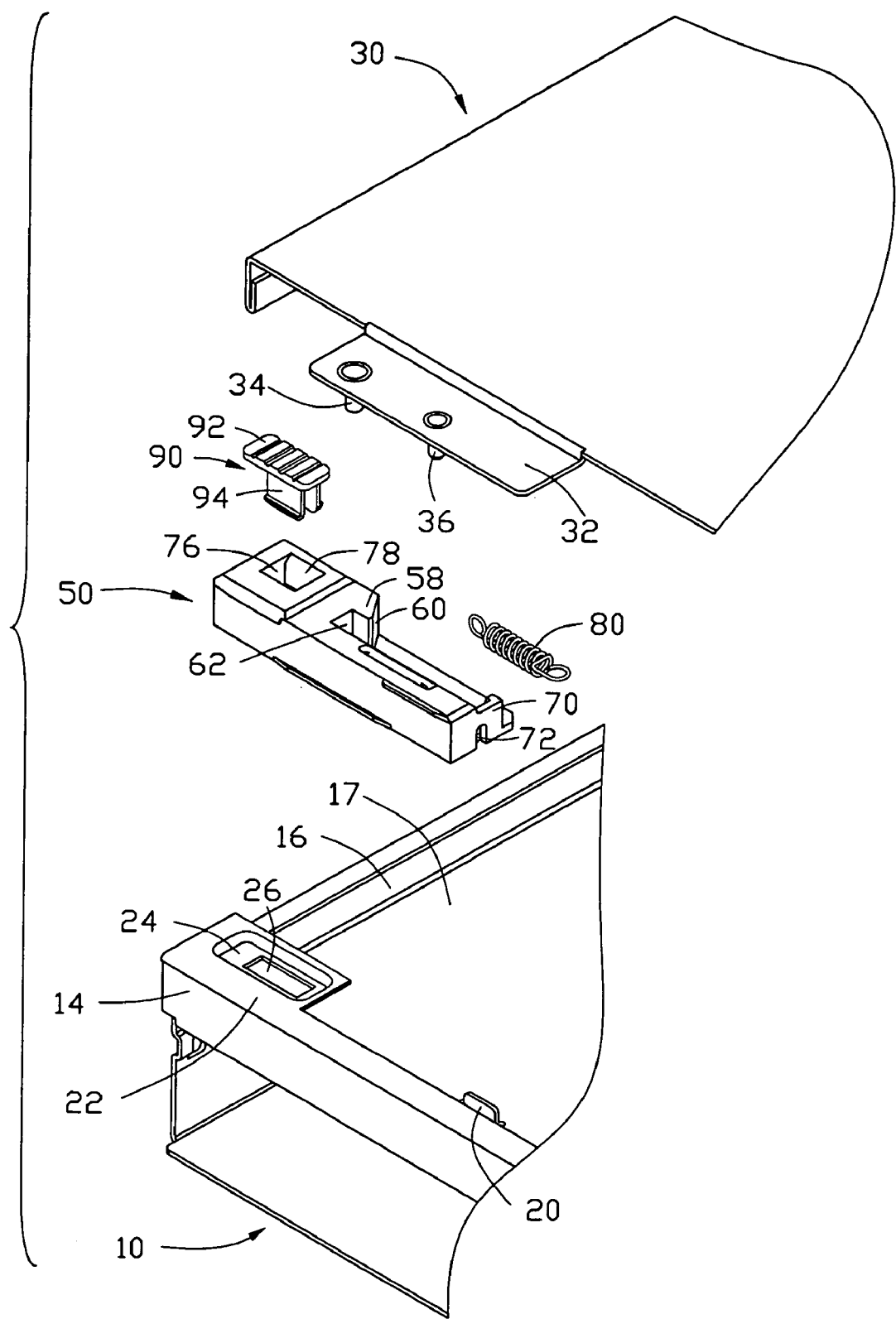
FIG. 3 is still an enlarged view of parts of FIG. 1, but viewed from another aspect.

Referring to FIGS. 1 to 3, an electronic device in accordance with a preferred embodiment of the present invention includes a cage 10, a hood 30, a fastener 50 attaching the hood 30 to the cage 10, a resilient member 80, and an operation member 90 mounted to the fastener 50.

The cage 10 includes a bottom wall 12, a rear wall 13 extending upwardly from a rear side of the bottom wall 12, a front wall 14 extending upwardly from a front side of the bottom wall 12, and a pair of sidewalls 15, 16 extending upwardly from two opposites sides of the bottom wall 12. A mounting wall 17 parallel to the bottom wall 12 is formed adjacent the front wall 14 and between the two sidewalls 15, 16. A hitching tab 18 is stamped upwardly from the mounting wall 17 adjacent the front wall 14. A limiting tab 20 is stamped upwardly from the mounting wall 17 adjacent the front wall 14, and between the hitching tab 18 and the sidewall 16. A flange 22 is bent rearward from a top of the front wall 14. The flange 22 defines a sunken 24 therein adjacent the sidewall 16. A through hole 26 is defined in a bottom of the sunken 24. A plurality of splits 28 is defined in the sidewalls 15, 16 respectively.

The hood 30 includes a fixing tab 32 extending from a front side thereof. A first post 34 and a second post 36 extend downwardly from the fixing tab 32 to perform as a first means and a second means for engagement respectively. A plurality of L-shaped hooks 38 extends from two opposite sides of the hood 30, corresponding to the splits 28 of the cage 10.

The fastener 50 defines a dent 56 in a rear portion of one end thereof. A mounting hole 76 is defined in a top of the other end of the fastener 50. A pair of protrusions 78 extends downwardly from the fastener 50 at opposite sides of the mounting hole 76. The fastener 50 includes a projection member 58 extending into the dent 56 from one end of the dent 56 adjacent the mounting hole 76. A rear portion of the projection member 58 forms a first guiding surface 60 slantingly toward the dent 56. A receiving slot 62 is formed between a front portion of the projection member 58 and a front side of the dent 56 to perform as a first complementary means for engagement corresponding to the first means as the first post 34 of the hood 30. A hooking tab 70 is extended upwardly from the other end of the dent 56 opposite to the projection member 58. A hooking hole 72 is defined in the hooking tab 70. An elastic fixing portion 64 extends at the front side of the dent 56 from one end of the dent 56 adjacent the projection member 58 toward the opposite side of the dent 56 so as to perform as a second complementary means for engagement corresponding to the second means as the second post 36 of the hood 30. A second guiding surface 66 extends slantingly from a distal end of the fixing portion 64 toward the hooking tab 70. A location surface 68 extends slantingly from the distal end of the fixing portion 64 toward the projection member 58.

The operation member 90 includes an operation portion 92, and a pair of fixing claws 94 extending downwardly from opposite sides of the operation portion 92.

Figure 4:
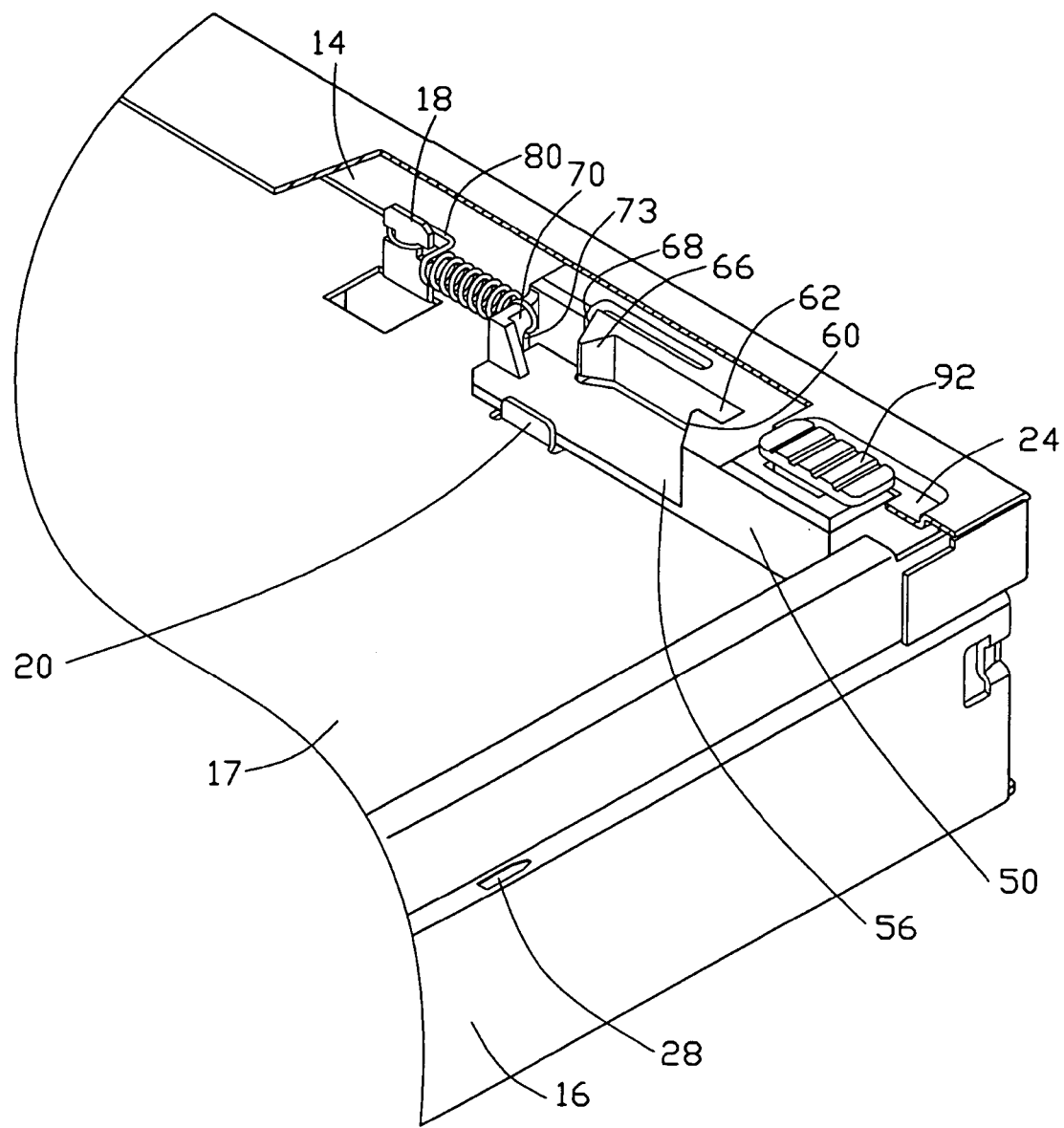
FIG. 4 is an assembled view of FIG. 2, but not showing the hood.

Referring also to FIG. 4, in assembling the fastener 50, the resilient member 80, and the operation member 90 to the cage 10, the fastener 50 is placed on the mounting wall 17 between the hitching tab 18 and the sidewall 16. The fastener 50 is also placed between the front panel 14 and the limiting tab 20. Two ends of the resilient member 80 are connected to the hitching tab 18 of the mounting wall 17, and the hooking tab 70 of the fastener 50 respectively. The fixing claws 94 of the operation member 90 is extended through the through hole 26 of the cage 10 and the mounting hole 76 of the fastener 50 to engage with the protrusions 78 of the fastener 50.

Figure 5:
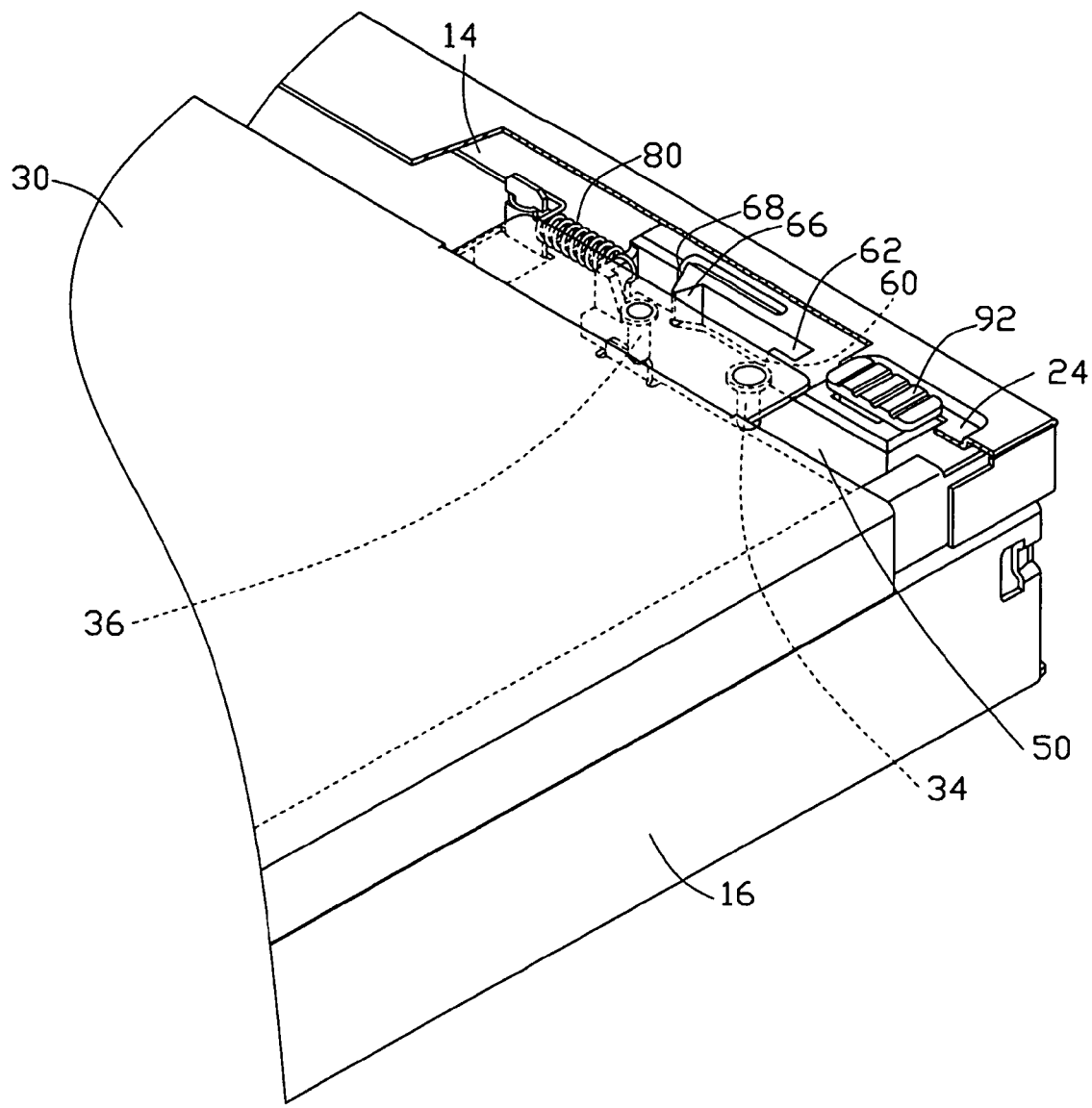
FIG. 5 is similar to FIG. 2, showing a state of the hood being secured to the cage.
Figure 6:
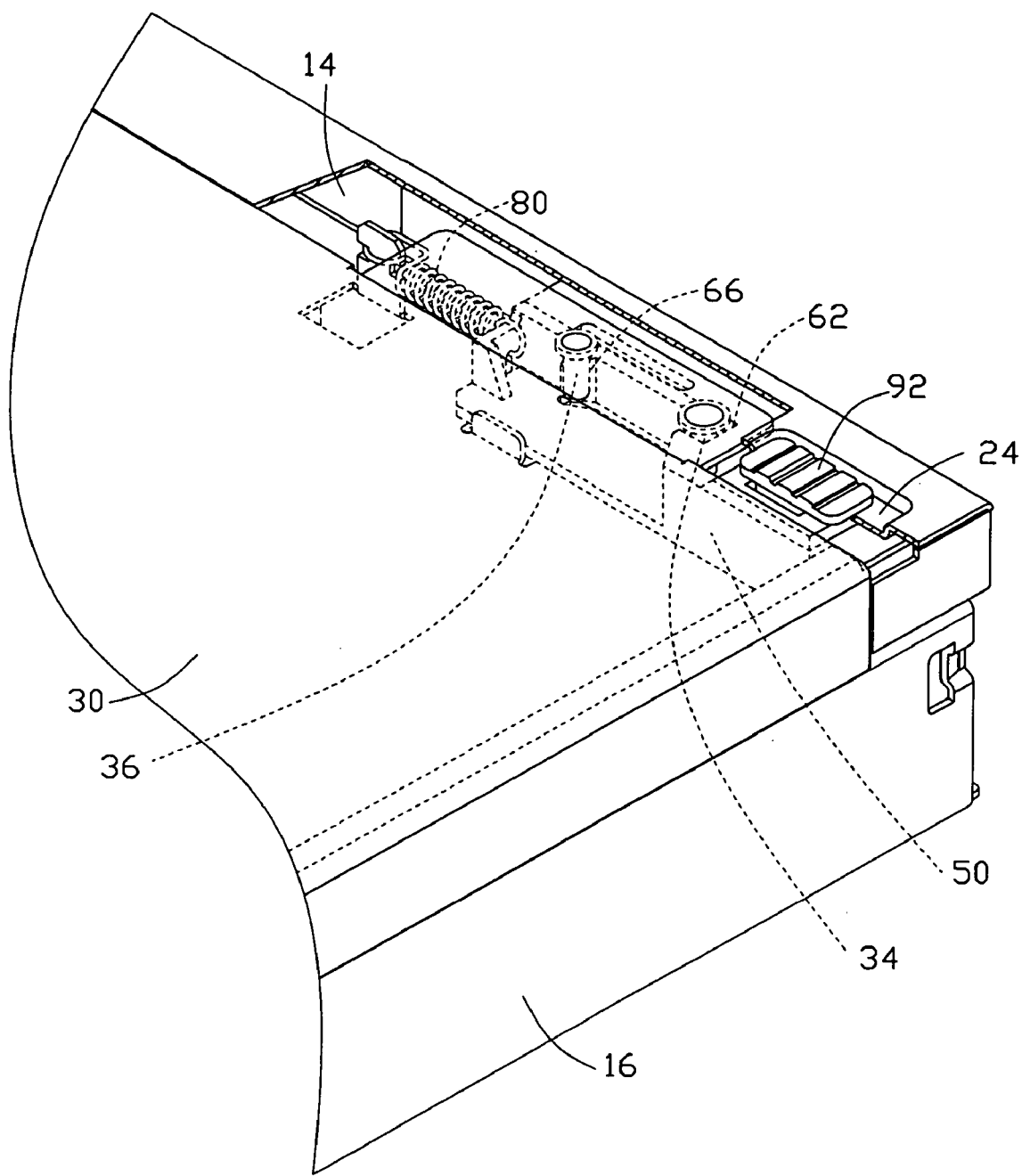
FIG. 6 is an assembled view of FIG. 2.
Figure 7:
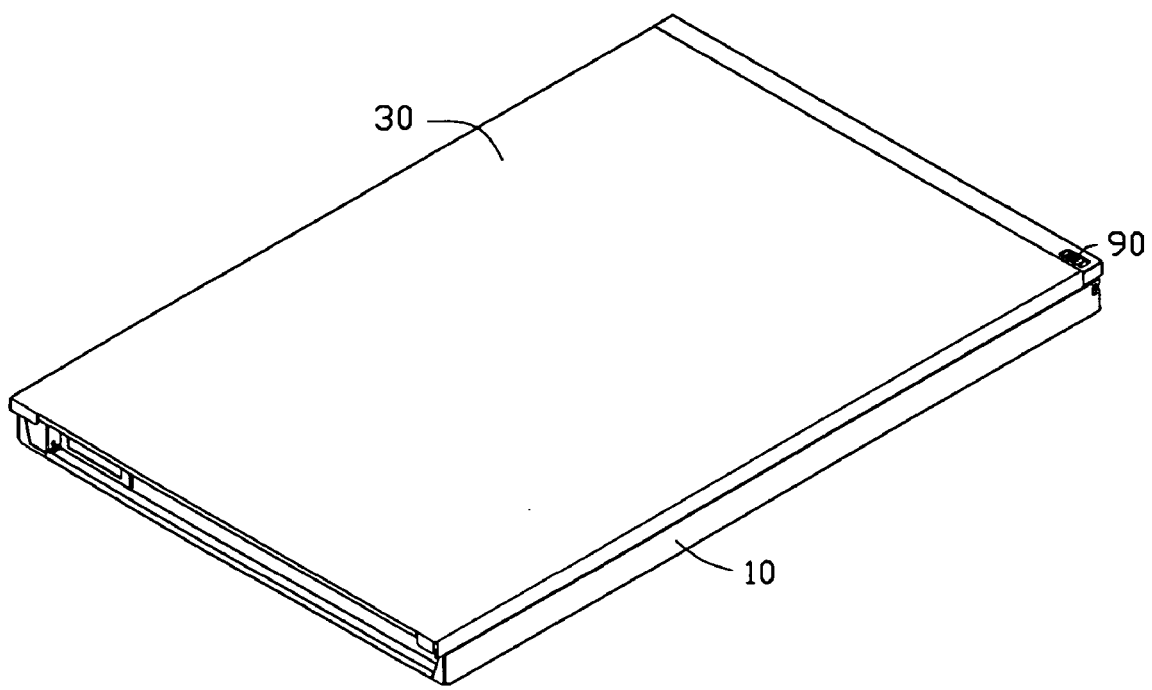
FIG. 7 is an assembled view of FIG. 1.

Referring also to FIGS. 5 to 7, in assembling the hood 30 to the cage 10, the hood 30 is attached to the cage 10. The hood 30 is pushed toward the front wall 14 of the cage 10. The first post 34 of the hood 30 slides on the first guiding surface 60 of the fastener 50 to drive the fastener 50 with the operation member 90 to slide toward the sidewall 16. The resilient member 80 is elastically stretched. The hood 30 is continued pushed till the first post 34 slides into the rear side of the projection member 58. The fastener 50 is drawn back via the resilient member 80. The fist post 34 of the hood is received in the receiving slot 62 of the fastener 50. The hooks 38 of the hood 30 are engaged in the splits 28 of the cage 10. Thus, the hood 30 is secured to the cage 10.

Figure 8:
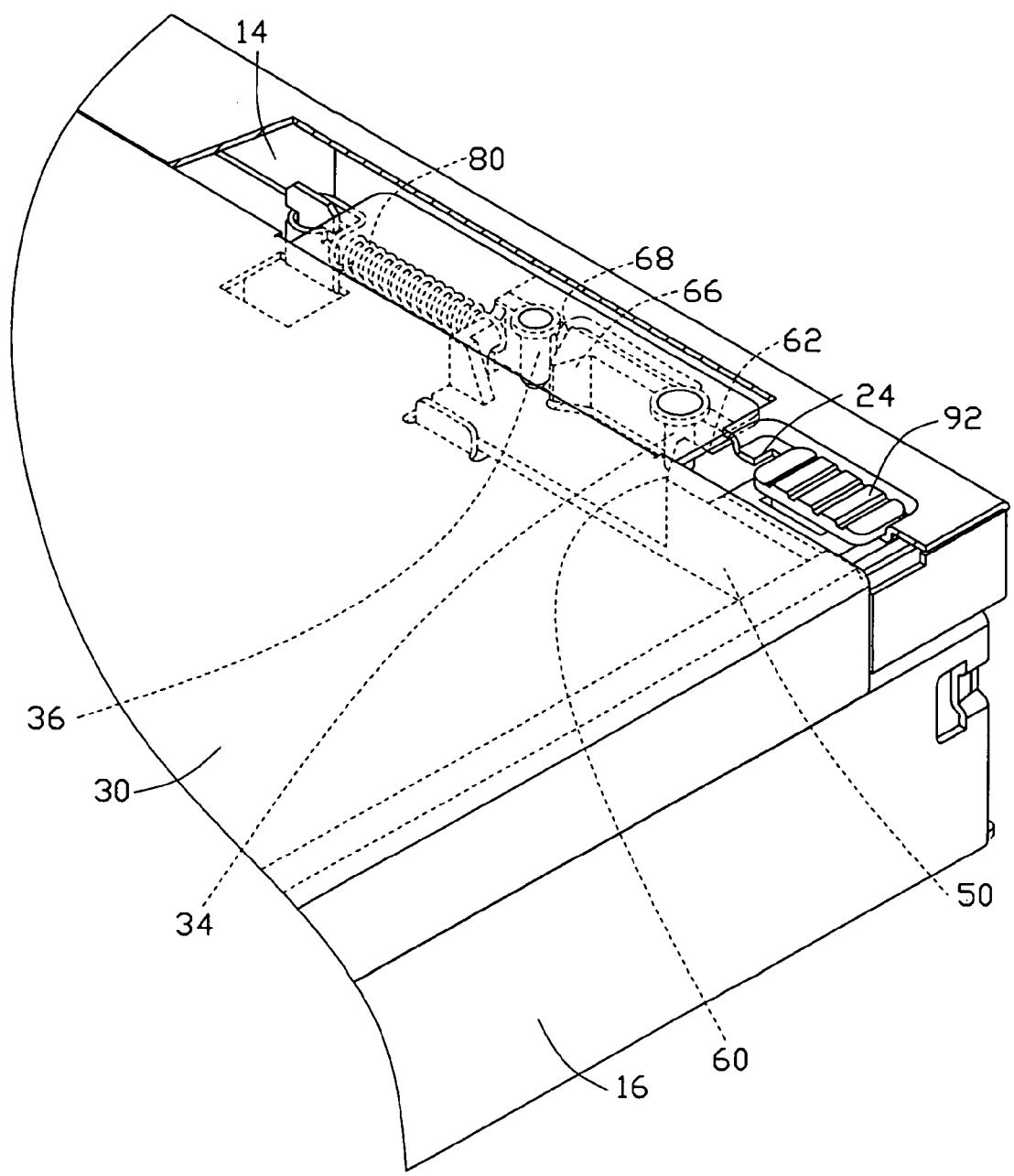
FIG. 8 is similar to FIG. 6, but showing the fastener in an unlocked position.

Referring also to FIG. 8, in removing the hood 30, the operation portion 92 of the operation member 90 is pushed toward the sidewall 16. The fastener 50 slides toward the sidewall 16 together with the operation member 90. The resilient member 80 is stretched. The second guiding surface 66 of the fixing portion 64 of the fastener 50 drives the second post 36 of the hood 30 to slide thereon. Thus, the hood 30 is pushed to slide away from the front wall 14 via the second guiding surface 66. The hood 30 is then removed rearward to release the hooks 38 from the splits 28 of the cage 10. The second post 36 is located on the location surface 68 after the second post 36 of the hood 30 rides over the second guiding surface 66. Thus, the hood 30 is easily taken out from the cage 10.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment of the invention.

We claim:

1. An electronic device comprising:
   a cage;
   a hood detachably secured to the cage, the hood comprising a first post and a second post extending downwardly from a side thereof respectively;
   a fastener movably mounted to the cage, the fastener comprising a first guiding surface for the first post of the hood sliding thereon during assembling the hood to the cage, and a second guiding surface for the second post of the hood sliding thereon during removing the hood from the cage; and
   a resilient member connected between the fastener and the cage.

2. The electronic device as claimed in claim 1, wherein the cage comprises a bottom wall, a front wall extending from a front side of the bottom wall, a first and a second sidewall extending upwardly from opposite sides of the bottom wall respectively, a plurality of splits is defined in the first and second sidewalls, a plurality of hooks extends downwardly from opposite sides of the hood, corresponding to the splits of the cage.

3. The electronic device as claimed in claim 2, wherein a mounting wall parallel to the bottom wall is formed adjacent the front wall, and between the first and second sidewalls, the fastener is slidably mounted to the mounting wall.

4. The electronic device as claimed in claim 3, wherein a hitching tab is stamped upwardly from the mounting wall adjacent the front wall, the fastener is slidably mounted between the hitching tab and the second sidewall, two ends of the resilient member are connected to the hitching tab and the fastener.

5. The electronic device as claimed in claim 3, wherein the hood comprises a fixing tab extending forwardly from a side thereof, the first and second posts extend downwardly from the fixing tab.

6. The electronic device as claimed in claim 2, wherein a flange is bent rearward from a top of the front wall, a through hole is defined in the flange adjacent the second sidewall, the fastener defines a dent in a rear portion of one end thereof, a mounting hole is defined in the other end of the fastener, corresponding to the through hole of the flange.

7. The electronic device as claimed in claim 6, wherein the fastener comprises a projection member extending into the dent from one end of the dent adjacent the mounting hole, the first guiding surface slantingly toward the dent is formed on a rear side of the projection member.

8. The electronic device as claimed in claim 7, wherein a receiving slot is formed between a front portion of the projection member and a front side of the dent.

9. The electronic device as claimed in claim 7, wherein an elastic fixing portion extends at a front side of the dent from one end of the dent adjacent the projection member toward the opposite side of the dent, the second guiding surface extends slantingly from a distal end of the fixing portion and away the end of the dent adjacent the mounting hole.

10. The electronic device as claimed in claim 9, wherein a location surface extends slantingly from the distal end of the fixing portion toward the projection member.

11. The electronic device as claimed in claim 6, wherein an operation member is extended through the through hole of the cage to engage in the mounting hole of the fastener.

12. An electronic device comprising:
    a cage comprising a mounting wall, a front wall perpendicularly to the mounting wall, a flange extended from the front wall parallel to the mounting wall, the flange defining a through hole therein;
    a hood detachably secured to the cage, the hood comprising a first post extending downwardly from a side thereof respectively;
    a fastener movably mounted to the cage, the fastener comprising a first guiding surface for the first post of the hood sliding thereon during assembling the hood to the cage, and an operation member exposed through the through hole of the flange of the cage; and
    a resilient member connected between the fastener and the cage.

13. The electronic device as claimed in claim 12, wherein the cage further comprises a bottom wall, and a first and a second sidewall extending upwardly from opposite sides of the bottom wall respectively, a plurality of splits is defined in the first and second sidewalls, a plurality of hooks extends downwardly from opposite sides of the hood, corresponding to the splits of the cage, the hood is movably along upper edges of the cage between an engagement position with the cage and an disengagement position with the cage.

14. The electronic device as claimed in claim 13, wherein the hood comprises a fixing tab extending forwardly from a side thereof, the first post extends downwardly from the fixing tab.

15. The electronic device as claimed in claim 13, wherein the mounting wall is parallel to the bottom wall adjacent the front wall, and between the first and second sidewalls, the fastener is slidably mounted to the mounting wall, two ends of the resilient member are connected to the mounting wall and the fastener.

16. The electronic device as claimed in claim 15, wherein the fastener defines a dent in a rear portion of one end thereof, a mounting hole is defined in the other end of the fastener, corresponding to the through hole of the flange.

17. The electronic device as claimed in claim 16, wherein the fastener comprises a projection member extending into the dent from one end of the dent adjacent the mounting hole, the first guiding surface slantingly toward the dent is formed on a rear side of the projection member.

18. The electronic device as claimed in claim 17, wherein a receiving slot is formed between a front portion of the projection member and a front side of the dent.

19. An electronic device comprising:
 a cage of said electronic device partially enclosing said electronic device and defining an access along a side thereof into said electronic device;
 a hood removably attachable to said side of said cage so as to jointly enclose said electronic device with said cage in a final position of said hood relative to said cage in order to block said access, said hood comprising a first means and a second means extending therefrom respectively; and
 a fastener movably installable in said cage beside said side of said cage, said fastener resiliently movable relative to said cage between a first position thereof to retain said hood in said final position thereof and a second position thereof to release said hood for removal of said hood away from said final position thereof, said fastener comprising a first complementary means and a second complementary means corresponding to said first and second means of said hood respectively, engagement between said first means and said first complementary means enabling retention of said hood in said final position thereof, and engagement between said second means and said second complementary means enabling retention of said fastener in said second position thereof when said hood is in said final position thereof.

20. The electronic device as claimed in claim 19, wherein movement of said fastener from said first position thereof to said second position thereof triggers said engagement between said second means and said second complementary means.

* * * * *